US012695264B2

(12) United States Patent
Fujimaki et al.

(10) Patent No.: US 12,695,264 B2
(45) Date of Patent: Jul. 28, 2026

(54) LASER APPARATUS AND ELECTRONIC DEVICE MANUFACTURING METHOD

(71) Applicant: Gigaphoton Inc., Tochigi (JP)

(72) Inventors: Yousuke Fujimaki, Oyama (JP);
Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 83 days.

(21) Appl. No.: 18/972,395

(22) Filed: Dec. 6, 2024

(65) Prior Publication Data

US 2025/0246864 A1     Jul. 31, 2025

(30) Foreign Application Priority Data

Jan. 30, 2024     (JP) ................................. 2024-012142

(51) Int. Cl.
| | |
|---|---|
| *H01S 3/038* | (2006.01) |
| *G03F 7/00* | (2006.01) |
| *H01S 3/034* | (2006.01) |
| *H01S 3/083* | (2006.01) |

(52) U.S. Cl.
CPC .......... *H01S 3/038* (2013.01); *G03F 7/70025* (2013.01); *H01S 3/034* (2013.01); *H01S 3/0835* (2013.01)

(58) Field of Classification Search
CPC ........ H01S 3/038; H01S 3/034; H01S 3/0835; H01S 3/03; H01S 3/08009; H01S 3/225; H01S 3/2366; H01S 3/2375; G03F 7/70025; H10P 76/2042
See application file for complete search history.

(56) References Cited

U.S. PATENT DOCUMENTS

| | | | | |
|---|---|---|---|---|
| 7,782,922 | B2 * | 8/2010 | Hori ........................ | H01S 3/225 |
| | | | | 372/55 |
| 8,514,899 | B2 * | 8/2013 | Onose ................... | H01S 3/2316 |
| | | | | 372/21 |
| 11,870,209 | B2 * | 1/2024 | Tamaru ............... | H01S 3/10084 |
| 2013/0279526 | A1 * | 10/2013 | Kakizaki .............. | H01S 3/2375 |
| | | | | 372/98 |

FOREIGN PATENT DOCUMENTS

JP          2010-010551 A      1/2010

* cited by examiner

*Primary Examiner* — Hung V Nguyen
(74) *Attorney, Agent, or Firm* — Studebaker Brackett PLLC

(57)     ABSTRACT

A laser apparatus includes an oscillation stage laser configured to generate and output a pulse laser beam, and an amplification stage laser configured to amplify the pulse laser beam output from the oscillation stage laser. The amplification stage laser includes an optical resonator configured to be a transfer optical system, a first discharge electrode pair and a second discharge electrode pair separated from each other in a first direction intersecting an optical path of the optical resonator, the first and second discharge electrode pairs being disposed across the optical path and configured to alternately discharge, and a slit disposed at a transfer position of the transfer optical system and configured to limit a beam size in a second direction orthogonal to the first direction of the pulse laser beam amplified by discharge of one of the first and second discharge electrode pairs.

19 Claims, 6 Drawing Sheets

LASER APPARATUS AND ELECTRONIC DEVICE MANUFACTURING METHOD

CROSS-REFERENCE TO RELATED APPLICATIONS

The present application claims the benefit of Japanese Patent Application No. 2024-012142, filed on Jan. 30, 2024, the entire contents of which are hereby incorporated by reference.

BACKGROUND

1. Technical Field

The present disclosure relates to a laser apparatus and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser apparatus for exposure, a KrF excimer laser apparatus that outputs a laser beam having a wavelength of about 248 nm and an ArF excimer laser apparatus that outputs a laser beam having a wavelength of about 193 nm are used.

Spectral linewidths of spontaneous oscillation beams of the KrF excimer laser apparatus and the ArF excimer laser apparatus are as wide as from 350 pm to 400 pm. Therefore, when a projection lens is formed of a material that transmits ultraviolet light such as KrF and ArF laser beams, chromatic aberration may occur. As a result, the resolution may decrease. Thus, the spectral linewidth of the laser beam output from the gas laser apparatus needs to be narrowed to an extent that the chromatic aberration is ignorable. Therefore, in a laser resonator of the gas laser apparatus, a line narrowing module (LNM) including a line narrowing element (such as etalon or grating) may be provided in order to narrow the spectral linewidth. Hereinafter, a gas laser apparatus with a narrowed spectral linewidth is referred to as a line narrowing gas laser apparatus.

LIST OF DOCUMENTS

Patent Documents

Patent Document 1: Japanese Unexamined Patent Application Publication No. 2010-10551

SUMMARY

A laser apparatus according to one aspect of the present disclosure includes an oscillation stage laser and an amplification stage laser. The oscillation stage laser is configured to generate and output a pulse laser beam. The amplification stage laser is configured to amplify the pulse laser beam output from the oscillation stage laser. The amplification stage laser includes an optical resonator configured to be a transfer optical system, a first discharge electrode pair and a second discharge electrode pair separated from each other in a first direction intersecting an optical path of the optical resonator, the first discharge electrode pair and the second discharge electrode pair being disposed across the optical path and configured to alternately discharge, and a slit disposed at a transfer position of the transfer optical system and configured to limit a beam size in a second direction orthogonal to the first direction of the pulse laser beam amplified by discharge of one of the first discharge electrode pair and the second discharge electrode pair.

An electronic device manufacturing method according to another aspect of the present disclosure includes generating a laser beam with a laser apparatus, outputting the laser beam to an exposure apparatus, and exposing a photosensitive substrate to the laser beam within the exposure apparatus to manufacture an electronic device. The laser apparatus includes an oscillation stage laser configured to generate and output a pulse laser beam, and an amplification stage laser configured to amplify the pulse laser beam output from the oscillation stage laser. The amplification stage laser includes an optical resonator configured to be a transfer optical system, a first discharge electrode pair and a second discharge electrode pair separated from each other in a first direction intersecting an optical path of the optical resonator, the first discharge electrode pair and the second discharge electrode pair being disposed across the optical path and configured to alternately discharge, and a slit disposed at a transfer position of the transfer optical system and configured to limit a beam size in a second direction orthogonal to the first direction of the pulse laser beam amplified by discharge of one of the first discharge electrode pair and the second discharge electrode pair.

BRIEF DESCRIPTION OF THE DRAWINGS

Some embodiments of the present disclosure will be described below, by way of example only, with reference to the accompanying drawings.

FIG. 4 is a sectional view schematically illustrating a cross section perpendicular to an optical path of a chamber where a slit is disposed.

DESCRIPTION OF EMBODIMENTS

Contents

1. Overview of Laser Apparatus according to Comparative Example
  1.1 Configuration
  1.2 Operation
  1.3 Problem
2. Embodiment 1
  2.1 Configuration
  2.2 Operation
  2.3 Effect
3. Embodiment 2
  3.1 Configuration
  3.2 Operation
  3.3 Effect 4. Embodiment 3
    4.1 Configuration
    4.2 Operation
    4.3 Effect
5. Modification
6. Electronic Device Manufacturing Method
7. Others Hereinafter, embodiments of the present disclosure will be described in detail with reference to the drawings. The embodiments described below show some examples of the present disclosure and do not limit contents of the present disclosure. In addition, all configurations and operations described in the embodiments are not necessarily essential as configurations and operations of the present disclosure. Here, the same components are denoted by the same reference signs, and any redundant description thereof is omitted.

1. Overview of Laser Apparatus According to Comparative Example

1.1 Configuration

Figure 1:
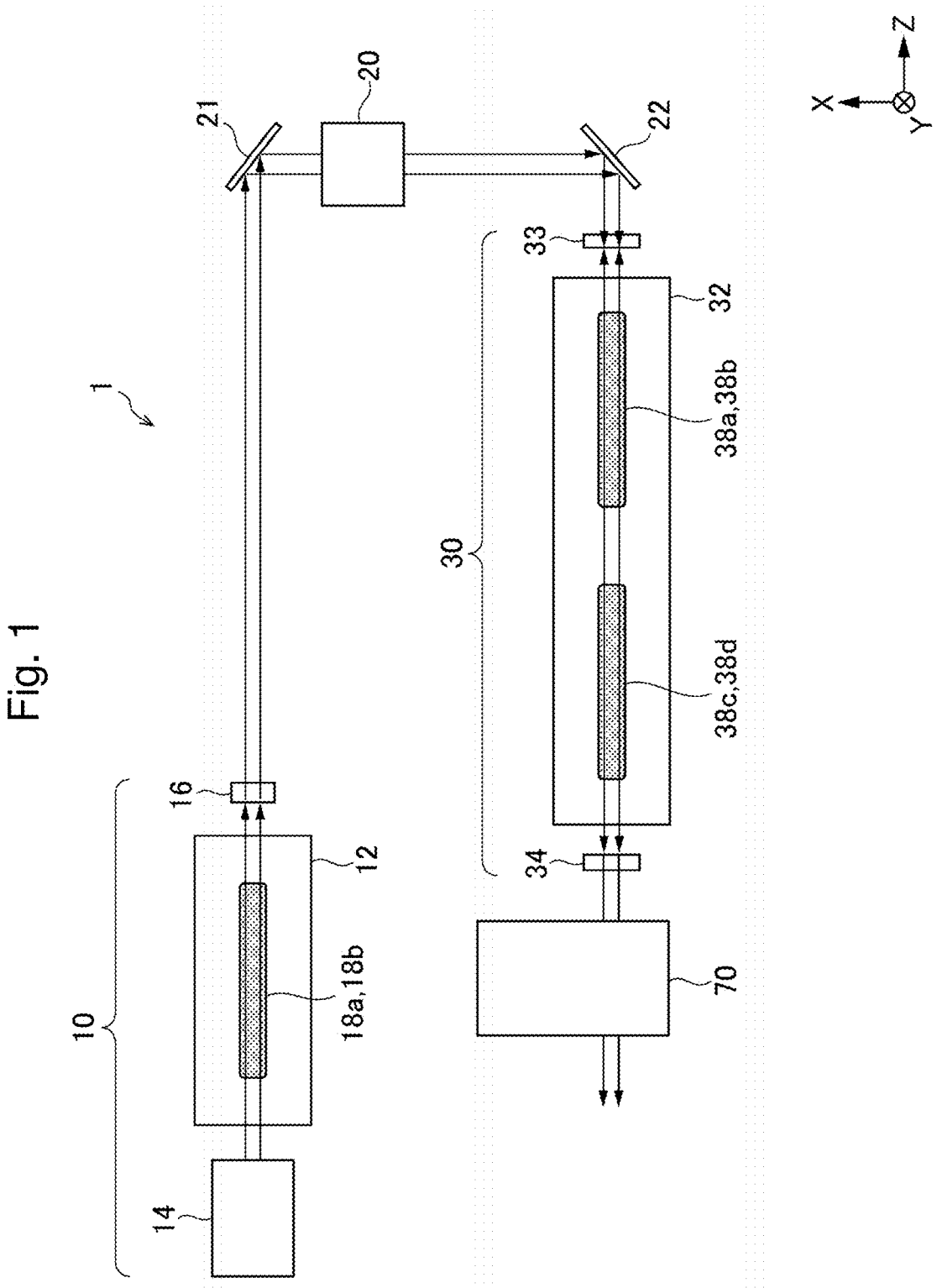
FIG. 1 is a diagram schematically illustrating a configuration of a laser apparatus according to a comparative example.

FIG. 1 is a diagram schematically illustrating a configuration of a laser apparatus 1 according to a comparative example. The comparative example of the present disclosure is an example recognized by the applicant as known only by the applicant, and is not a publicly known example admitted by the applicant. As illustrated in FIG. 1, the laser apparatus 1 includes an oscillation stage laser 10, a beam expander 20, high reflective mirrors 21 and 22, an amplification stage laser 30, and a monitor module 70.

The oscillation stage laser 10 includes a chamber 12, a line narrowing module (LNM) 14, and an output coupler (OC) 16. The LNM 14 and the OC 16 form an optical resonator together, and the chamber 12 is disposed on an optical path of the optical resonator.

A pair of discharge electrodes 18a and 18b are disposed inside the chamber 12. The discharge electrodes 18a and 18b are separated from each other by a predetermined distance in a Y direction intersecting the optical path of the optical resonator, and are disposed such that their longitudinal directions are parallel to each other and their discharge surfaces face each other across the optical path. In FIG. 1, a direction perpendicular to a plane of the figure is the Y direction. The Y direction corresponds to a discharge direction. In FIG. 1, a direction of the optical path of the optical resonator is defined as a Z direction, and a direction perpendicular to the Y direction and the Z direction is defined as an X direction. The same applies to FIGS. 2 to 5. However, in FIG. 4, the direction perpendicular to the plane of the figure is the Z direction.

The oscillation stage laser 10 includes an oscillation stage power source including an unillustrated oscillation stage high voltage pulse generator and an unillustrated charger. The discharge electrodes 18a and 18b are connected to the oscillation stage power source, and a high voltage pulse is applied by the oscillation stage power source.

The chamber 12 is filled with a laser gas. The laser gas is, for example, a mixed gas of an argon (Ar) gas, a fluorine ($F_2$) gas, and a neon (Ne) gas. A cross-flow fan and a heat exchanger that are not illustrated are disposed inside the chamber 12.

The chamber 12 is provided with unillustrated windows on both ends in the Z direction. The windows are disposed on an optical path of a pulse laser beam at an output part of the chamber 12. The windows are transparent to a wavelength (for example, 193 nm) of the pulse laser beam. A material of the windows is, for example, calcium fluoride ($CaF_2$).

The amplification stage laser 30 includes a chamber 32, a rear mirror 33, and an OC 34. The high reflective mirror 21, the beam expander 20, and the high reflective mirror 22 are disposed in an optical path between the OC 16 of the oscillation stage laser 10 and the rear mirror 33 of the amplification stage laser 30.

The rear mirror 33 and the OC 34 form an optical resonator together, and the chamber 32 is disposed on an optical path of the optical resonator. Two pairs of discharge electrodes 38a and 38b and discharge electrodes 38c and 38d are disposed inside the chamber 32. One of the discharge electrodes 38a and 38b in a pair and one of the discharge electrodes 38c and 38d in a pair are separated from the other discharge electrode in the same pair by a predetermined distance in the Y direction intersecting the optical path of the optical resonator, and each pair is disposed such that longitudinal directions of the discharge electrodes in the pair are parallel to each other and discharge surfaces of the discharge electrodes in the pair face each other across the optical path. The two sets of discharge electrode pairs alternately discharge, thereby realizing a high repetitive operation.

The amplification stage laser 30 includes a first amplification stage power source including an unillustrated first amplification stage high voltage pulse generator and an unillustrated first charger, and a second amplification stage power source including an unillustrated second amplification stage high voltage pulse generator and an unillustrated second charger. The discharge electrodes 38a and 38b are connected to the first amplification stage power source, and a high voltage pulse is applied by the first amplification stage power source. The discharge electrodes 38c and 38d are connected to the second amplification stage power source, and a high voltage pulse is applied by the second amplification stage power source.

Since the amplification stage laser 30 requires higher energy than the oscillation stage laser 10, each of a separation interval of the discharge electrodes 38a and 38b and a separation interval of the discharge electrodes 38c and 38d of the amplification stage laser 30 is wider than a separation interval of the discharge electrodes 18a and 18b of the oscillation stage laser 10. The separation interval of the discharge electrodes 38a and 38b and the separation interval of the discharge electrodes 38c and 38d may be a same distance. An electrode length of the discharge electrodes 38a and 38b and an electrode length of the discharge electrodes 38c and 38d may be a same length. The electrode length refers to a length of the discharge electrode in the longitudinal direction. In FIG. 1, the longitudinal direction of the discharge electrodes 38a, 38b, 38c, and 38d is the Z direction.

In order to align a beam size in the Y direction of the pulse laser beam output from the oscillation stage laser 10 with the separation interval of each electrode pair of the discharge electrodes 38a and 38b and the discharge electrodes 38c and 38d in the amplification stage laser 30, the beam expander 20 widens the beam size in the Y direction of the pulse laser beam.

The chamber 32 is filled with a laser gas similar to that in the chamber 12. In the chamber 32, similarly to the chamber 12, a cross-flow fan and a heat exchanger that are not illustrated are disposed, and unillustrated windows are disposed at both ends in the Z direction at an output part of the chamber 32 on the optical path of the pulse laser beam.

The monitor module 70 includes an unillustrated energy detector that detects energy of the pulse laser beam output from the amplification stage laser 30, and an unillustrated spectrum detector that measures a wavelength and a spectral linewidth.

1.2 Operation

An operation of the laser apparatus 1 will be described with reference to FIG. 1. When a high voltage pulse is applied to the discharge electrodes 18a and 18b by the oscillation stage power source, discharge occurs between the discharge electrodes 18a and 18b, and the laser gas is excited. Then, resonance occurs in the optical resonator formed of the LNM 14 and the OC 16, and a pulse laser beam is generated. The LNM 14 is formed of an unillustrated magnifying prism and an unillustrated grating (diffraction grating) which is a wavelength selecting element, and narrows a spectral width of the pulse laser beam.

The cross-flow fan circulates the laser gas in the chamber 12 and replaces the laser gas between the discharge electrodes 18a and 18b. The heat exchanger exhausts heat in the chamber 12.

The pulse laser beam that has transmitted through the OC 16 is expanded at least in the Y direction by the beam expander 20, and is fed into the chamber 32 through the rear mirror 33 after a beam direction thereof has been changed by the high reflective mirror 21 and the high reflective mirror 22.

At a timing when the pulse laser beam enters a discharge space of the discharge electrodes 38a and 38b, a high voltage pulse is applied by the first amplification stage power source, discharge occurs between the discharge electrodes 38a and 38b, and the laser gas is excited. Then, resonance occurs in the optical resonator formed of the rear mirror 33 and the OC 34, and the pulse laser beam fed from the oscillation stage laser 10 is amplified.

Next, at a timing when the pulse laser beam enters a discharge space of the discharge electrodes 38c and 38d, a high voltage pulse is applied by the second amplification stage power source, discharge occurs between the discharge electrodes 38c and 38d, and the laser gas is excited. Then, resonance occurs in the optical resonator formed of the rear mirror 33 and the OC 34, and the pulse laser beam that has been fed from the oscillation stage laser 10 and has entered the amplification stage laser 30 is amplified.

The discharge by the discharge electrode pair of the discharge electrodes 38a and 38b and the discharge by the discharge electrode pair of the discharge electrodes 38c and 38d are alternately repeated. A repetition frequency of the discharge of the discharge electrodes 18a and 18b in the oscillation stage laser 10 is twice a repetition frequency of the discharge of each discharge electrode pair of the discharge electrodes 38a and 38b and the discharge electrodes 38c and 38d in the amplification stage laser 30.

The pulse laser beam output from the amplification stage laser 30 enters the monitor module 70. In the monitor module 70, the energy, the wavelength, and the spectral linewidth of the pulse laser beam are measured. A measurement result of the monitor module 70 is sent to an unillustrated laser control processor. The laser control processor controls the laser apparatus 1 so as to attain target pulse energy, a target wavelength, and a target spectral linewidth, based on the measurement result of the monitor module 70.

1.3 Problem

In the laser apparatus 1 in which timings of the discharge of the two sets of discharge electrode pairs disposed in the chamber 32 are shifted by a half cycle to cause alternate oscillation, the beam size is changed between the pulse laser beam amplified by the discharge of the discharge electrodes 38a and 38b disposed on the rear mirror 33 side and the pulse laser beam amplified by the discharge of the discharge electrodes 38c and 38d disposed on the OC 34 side.

That is, the beam size of the pulse laser beam amplified by the discharge of the discharge electrodes 38a and 38b on the rear mirror 33 side is larger than that of the pulse laser beam amplified by the discharge of the discharge electrodes 38c and 38d on the OC 34 side. Then, a size change rate of the beam size in the X direction orthogonal to the discharge direction is greater than that of the beam size in the discharge direction (Y direction).

In an exposure apparatus used in combination with the laser apparatus 1, when pulse laser beams having different beam sizes are alternately output from the laser apparatus 1, exposure performance is affected.

2. Embodiment 1

2.1 Configuration

Figure 2:
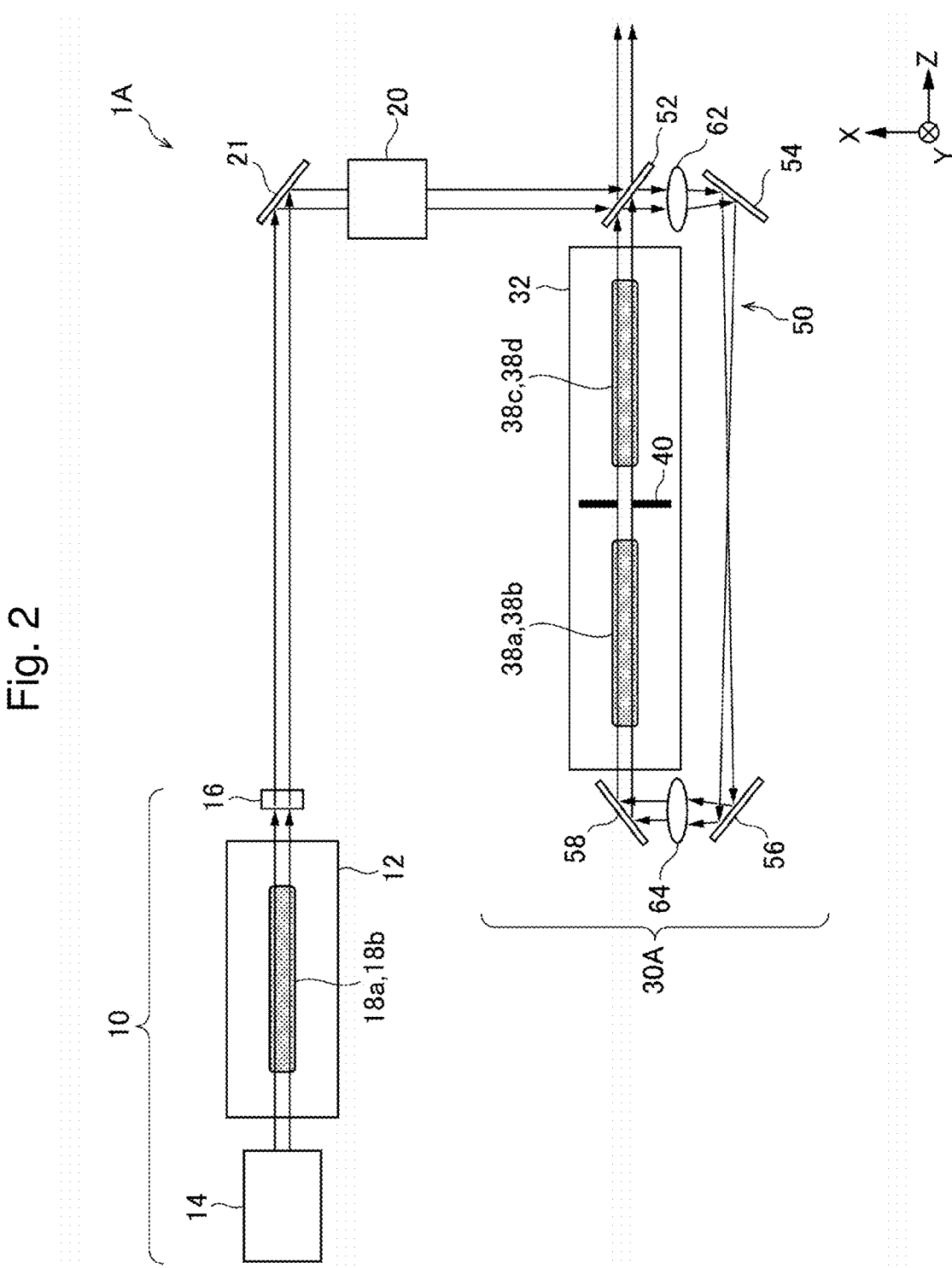
FIG. 2 is a diagram schematically illustrating a configuration of a laser apparatus according to Embodiment 1.

FIG. 2 is a diagram schematically illustrating a configuration of a laser apparatus 1A according to Embodiment 1. The configuration illustrated in FIG. 2 will be described in terms of differences from the configuration illustrated in FIG. 1.

In the laser apparatus 1A, the high reflective mirror 22 of the laser apparatus 1 is eliminated, and an amplification stage laser 30A is included instead of the amplification stage laser 30. The amplification stage laser 30A includes the chamber 32 and a ring resonator 50.

The ring resonator 50 includes an OC 52, a high reflective mirror 54, a high reflective mirror 56, a high reflective mirror 58, a lens 62, and a lens 64. The ring resonator 50 is a transfer optical system. Each of the lens 62 and the lens 64 is a light condensing lens, and when a focal length of each lens is f, a circulation distance of the ring resonator 50 may be 4 f. Each of the lens 62 and the lens 64 is of a spherical type.

The pulse laser beam output from the oscillation stage laser 10 enters the amplification stage laser 30A from the OC 52. A reflectance of the OC 52 is, for example, 10% to 20%.

The OC 52 is disposed so as to transmit a part of the pulse laser beam output from the beam expander 20 to make it enter the lens 62, and to transmit a part of the pulse laser beam having circulated in the ring resonator 50 and output from the chamber 32. The other part of the pulse laser beam output from the beam expander 20 is reflected by the OC 52, is multiplexed with the pulse laser beam having circulated in the ring resonator 50 and transmitted through the OC 52, and is output from the amplification stage laser 30A.

The lens 62 is disposed on an optical path between the OC 52 and the high reflective mirror 54. The lens 64 is disposed on an optical path between the high reflective mirror 56 and the high reflective mirror 58.

A light condensing position by the lens 62 and the lens 64 of the pulse laser beam that circulates in the ring resonator 50 is outside the chamber 32. The light condensing position may be, for example, between the high reflective mirror 54 and the high reflective mirror 56.

The pulse laser beam that circulates in the ring resonator 50 enters the lens 62, changes the beam direction by the high reflective mirror 54 to be focused, and is reflected by the high reflective mirror 56. After passing through the lens 64, the pulse laser beam reflected by the high reflective mirror 56 changes the beam direction by the high reflective mirror 58, and enters the chamber 32.

The discharge electrodes 38a and 38b, a slit 40, and the discharge electrodes 38c and 38d are disposed inside the chamber 32. One of the discharge electrodes 38a and 38b in a pair and one of the discharge electrodes 38c and 38d in a pair are separated from the other discharge electrode in the same pair in the Y direction intersecting an optical path of the ring resonator 50, and each pair is disposed such that the longitudinal directions of the discharge electrodes in the pair are parallel to each other and the discharge surfaces of the discharge electrodes in the pair face each other across the optical path. Then, the discharge electrodes 38a and 38b and the discharge electrodes 38c and 38d alternately discharge.

The chamber 32 is an example of a "first chamber" in the present disclosure. The discharge electrodes 38a and 38b are an example of a "first discharge electrode pair" in the present disclosure. The discharge electrodes 38c and 38d are an example of a "second discharge electrode pair" in the present disclosure. The lens 62 and the lens 64 are an example of "two light condensing lenses" in the present disclosure.

The slit 40 is disposed at a transfer position of the transfer optical system. When a circulation optical path length of the ring resonator 50 is to be realized as short as possible, the transfer position is between the electrode pair of the discharge electrodes 38a and 38b and the electrode pair of the discharge electrodes 38c and 38d.

The slit 40 limits the beam size in the X direction orthogonal to the Y direction intersecting the optical path of the ring resonator 50, that is, in the direction orthogonal to the discharge direction. In addition, the slit 40 may also limit the beam size in the Y direction intersecting the optical path of the ring resonator 50, that is, in the discharge direction. An opening size in the Y direction of the slit 40 in this case is equal to or shorter than the separation interval of the discharge electrode 38a and the discharge electrode 38b. In a case of the slit 40 that limits the beam size only in the X direction, each of the lens 62 and the lens 64 may be a cylindrical lens. The Y direction is an example of a "first direction" in the present disclosure. The X direction is an example of a "second direction" in the present disclosure.

The slit 40 may be formed of, for example, two divided plates to define a gap as a beam passing region or may be formed of a plate with a rectangular opening. A material of the plate (slit plate) forming a light shielding part of the slit 40 may be an electrically insulating material resistant to a fluorine gas, and may be, for example, alumina ceramics. The other configurations may be similar to those in FIG. 1.

2.2 Operation

A part of the pulse laser beam that has entered the OC 52 through the beam expander 20 is transmitted through the OC 52. The pulse laser beam transmitted through the OC 52 is condensed at the lens 62 to be focused between the high reflective mirror 54 and the high reflective mirror 56, and is then propagated while spreading. The pulse laser beam propagated while spreading changes the beam direction at the high reflective mirror 56, and is made into parallel light by the lens 64. The pulse laser beam, which is the parallel light, enters the chamber 32.

The discharge electrodes 38a and 38b and the discharge electrodes 38c and 38d alternately discharge, and the pulse laser beam that circulates in the ring resonator 50 is amplified in every circulation when passing through the discharge space of one of the two sets of discharge electrode pairs (the discharge electrodes 38a and 38b and the discharge electrodes 38c and 38d).

Every time the pulse laser beam circulates in the ring resonator 50, the beam size in the X direction orthogonal to the Y direction is limited by the slit 40. In this way, the pulse laser beam having the beam size equivalent to the beam size at the transfer position of the ring resonator 50, which is the transfer optical system, is output from the OC 52. As a result, the pulse laser beam having the beam size in the X direction equivalent to the size (slit width) in the X direction of the slit 40 is output from the OC 52.

2.3 Effect

With the laser apparatus 1A according to Embodiment 1, the beam size in the X direction orthogonal to the discharge direction is limited by the slit 40, and the pulse laser beam having the beam size equivalent to the beam size at the transfer position is output from the laser apparatus 1A. As a result, in the laser apparatus 1A including the amplification stage laser 30A in which the two sets of discharge electrode pairs alternately discharge, it is possible to suppress the change in the beam size in the direction (X direction) orthogonal to the discharge direction (Y direction) of the pulse laser beam to be output.

In the laser apparatus 1A according to Embodiment 1, when the slit 40 that also limits the beam size in the discharge direction is disposed, it is also possible to suppress the change in the beam size in the discharge direction of the pulse laser beam to be output.

With the laser apparatus 1A according to Embodiment 1, since the slit 40 is disposed at the transfer position of the ring resonator 50, the beam size can be limited without any effect on a beam spreading angle as compared with a case of not disposing the slit 40 at the transfer position. Further, with the laser apparatus 1A according to Embodiment 1, since the slit 40 is disposed at the transfer position of the ring resonator 50, energy loss is smaller than that in the case of disposing the slit 40 at a position other than the transfer position.

3. Embodiment 2

3.1 Configuration

Figure 3:
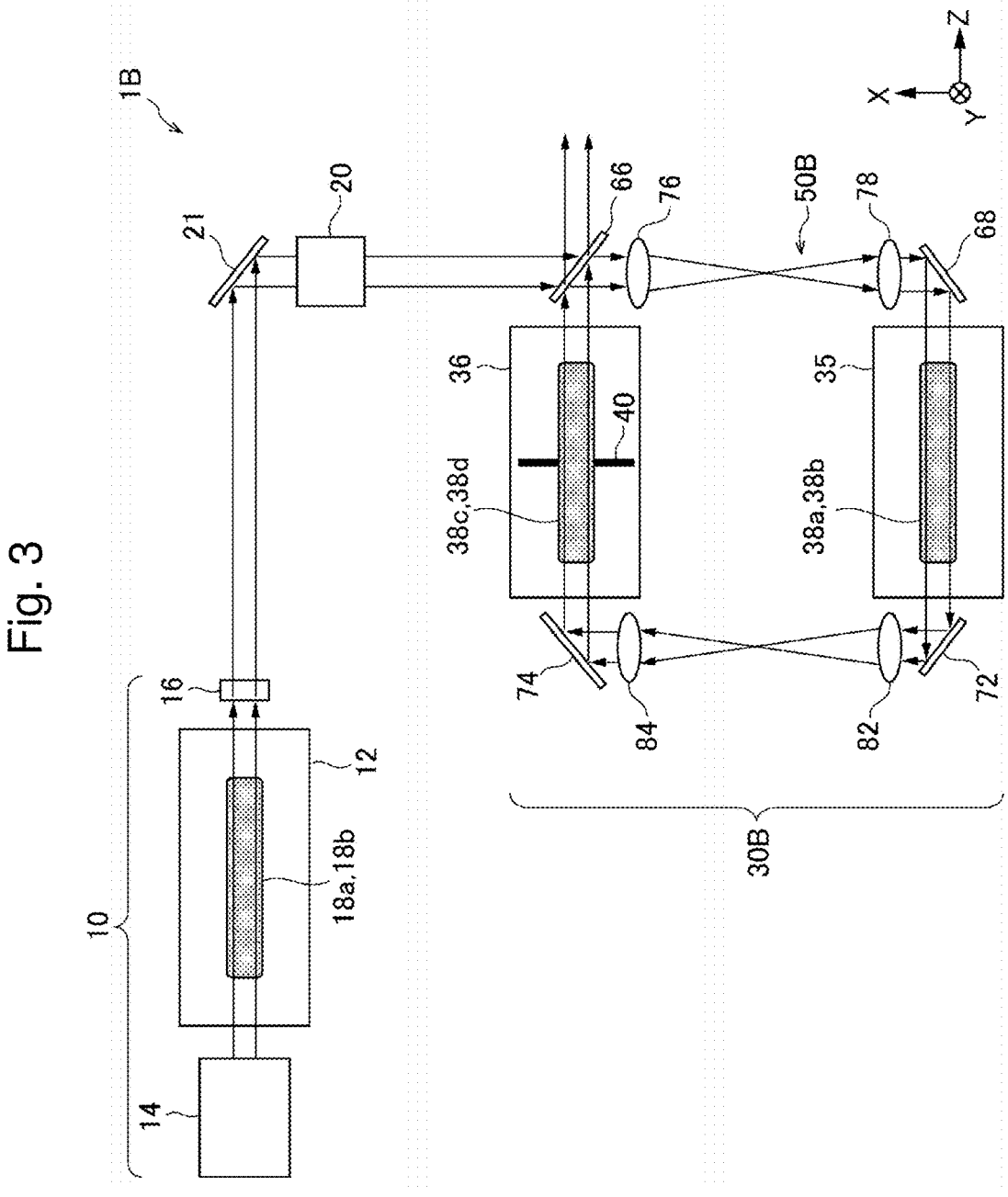
FIG. 3 is a diagram schematically illustrating a configuration of a laser apparatus according to Embodiment 2.

FIG. 3 is a diagram schematically illustrating a configuration of a laser apparatus 1B according to Embodiment 2. The configuration illustrated in FIG. 3 will be described in terms of differences from the configuration illustrated in FIG. 2.

The laser apparatus 1B includes an amplification stage laser 30B instead of the amplification stage laser 30A. The amplification stage laser 30B includes a chamber 35, a chamber 36, and a ring resonator 50B.

The ring resonator 50B is formed of an OC 66, a high reflective mirror 68, a high reflective mirror 72, a high reflective mirror 74, a lens 76, a lens 78, a lens 82, and a lens 84. The ring resonator 50B is a transfer optical system, and is configured such that transfer is performed twice in one circulation, and there are two transfer positions.

Each of the lens 76, the lens 78, the lens 82, and the lens 84 is a light condensing lens, and when a focal length of each lens is f, a circulation distance of the ring resonator 50 B may be 8 f.

The pulse laser beam output from the oscillation stage laser 10 enters the amplification stage laser 30B from the OC 66. A reflectance of the OC 66 is, for example, 10% to 20%.

The OC 66 is disposed so as to transmit a part of the pulse laser beam output from the beam expander 20 to make it enter the lens 76, and to transmit a part of the pulse laser beam having circulated in the ring resonator 50B and output from the chamber 36. The other part of the pulse laser beam output from the beam expander 20 is reflected by the OC 66, is multiplexed with the pulse laser beam having circulated in the ring resonator 50B and transmitted through the OC 66, and is output from the amplification stage laser 30B.

The lens 76 and the lens 78 are disposed on an optical path between the OC 66 and the high reflective mirror 68. The lens 82 and the lens 84 are disposed on an optical path between the high reflective mirror 72 and the high reflective mirror 74. The chamber 35 is disposed on an optical path between the high reflective mirror 68 and the high reflective mirror 72. The chamber 36 is disposed on an optical path between the high reflective mirror 74 and the OC 66.

Each of the chamber 35 and the chamber 36 is filled with a laser gas similar to that in the chamber 12. In each of the chamber 35 and the chamber 36, similarly to the chamber 12, a cross-flow fan and a heat exchanger that are not illustrated are disposed, and unillustrated windows are disposed at both ends in the Z direction at output parts of the chambers 35 and 36 on the optical path of the pulse laser beam.

Light condensing positions of the pulse laser beam that circulates in the ring resonator 50B by the lens 76 and the lens 78, and the lens 82 and the lens 84 are outside the chamber 35 and the chamber 36. The light condensing positions may be between the lens 76 and the lens 78 and between the lens 82 and the lens 84, for example.

The pulse laser beam that circulates in the ring resonator 50B enters the lens 76 through the OC 66 to be focused, passes through the lens 78, changes the beam direction by the high reflective mirror 68, and enters the chamber 35. The pulse laser beam output from the chamber 35 changes the beam direction by the high reflective mirror 72, is focused by the lens 82, and passes through the lens 84. The pulse laser beam that has passed through the lens 84 changes the beam direction by the high reflective mirror 74 and enters the chamber 36.

The discharge electrodes 38a and 38b are disposed inside the chamber 35. The discharge electrodes 38c and 38d and the slit 40 are disposed inside the chamber 36. One of the discharge electrodes 38a and 38b in a pair and one of the discharge electrodes 38c and 38d in a pair are separated from the other discharge electrode in the same pair in the direction (Y direction) intersecting an optical path of the ring resonator 50B, and each pair is disposed such that the longitudinal directions of the discharge electrodes in the pair are parallel to each other and the discharge surfaces of the discharge electrodes in the pair face each other across the optical path. Then, the discharge electrodes 38a and 38b and the discharge electrodes 38c and 38d alternately discharge. The chamber 35 is an example of a "second chamber" in the present disclosure. The chamber 36 is an example of a "third chamber" in the present disclosure.

The slit 40 is disposed at a transfer position of the transfer optical system. The transfer position may be a position where the discharge electrodes 38c and 38d are disposed. While FIG. 3 illustrates an example in which the slit 40 is disposed, of the two transfer positions, at the position where the discharge electrodes 38c and 38d are disposed, the transfer position where the slit 40 is disposed may be a position where the discharge electrodes 38a and 38b are disposed, or the slit 40 may be disposed at each of the two transfer positions. An opening size of the slit 40 when the slit 40 is disposed in the chamber 35 is the same as an opening size of the slit 40 when the slit 40 is disposed in the chamber 36. The other configurations may be similar to those in FIG. 2. The transfer position where the discharge electrodes 38a and 38b are disposed is an example of a "first position" in the present disclosure. The transfer position where the discharge electrodes 38c and 38d are disposed is an example of a "second position" in the present disclosure.

Figure 4:
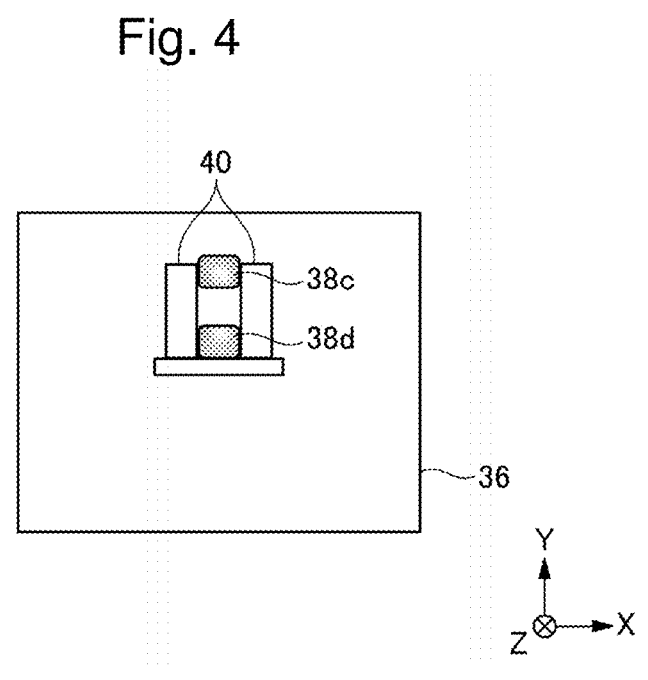

FIG. 4 is a sectional view schematically illustrating a cross section perpendicular to an optical path of the chamber 36 where the slit 40 is disposed. FIG. 4 illustrates a sectional view at the transfer position where the slit 40 is disposed. As illustrated in FIG. 4, the slit 40 may be formed of two divided plates to define a gap as a beam passing region.

3.2 Operation

As illustrated in FIG. 3, the pulse laser beam transmitted through the OC 66 is condensed by the lens 76 to be focused, and is then made into parallel light by the lens 78. Then, the pulse laser beam that has been made into the parallel light changes the beam direction by the high reflective mirror 68, and enters the chamber 35.

The pulse laser beam output from the chamber 35 changes the beam direction by the high reflective mirror 72, is condensed by the lens 82 to be focused, and is then made into parallel light by the lens 84. Then, the pulse laser beam that has been made into the parallel light changes the beam direction by the high reflective mirror 74, and enters chamber 36.

The pulse laser beam that circulates in the ring resonator 50B is amplified in every circulation when passing through the discharge space of one of the two pairs of the discharge electrodes 38a and 38b and the discharge electrodes 38c and 38d.

Every time the pulse laser beam circulates in the ring resonator 50B, the beam size in the X direction orthogonal to the Y direction is limited by the slit 40. In this way, the pulse laser beam having the beam size equivalent to the beam size at the transfer position of the ring resonator 50, which is the transfer optical system, is output from the OC 66. As a result, the pulse laser beam having the beam size in the X direction equivalent to the size (slit width) in the X direction of the slit 40 is output from the OC 66. The rest of the operation is similar to that of the laser apparatus 1A.

3.3 Effect

With the laser apparatus 1B according to Embodiment 2, the same effects as those of the laser apparatus 1A can be obtained. Further, the chamber 35 and the chamber 36 in Embodiment 2 can be made smaller than the chamber 32 in Embodiment 1.

4. Embodiment 3

4.1 Configuration

Figure 5:
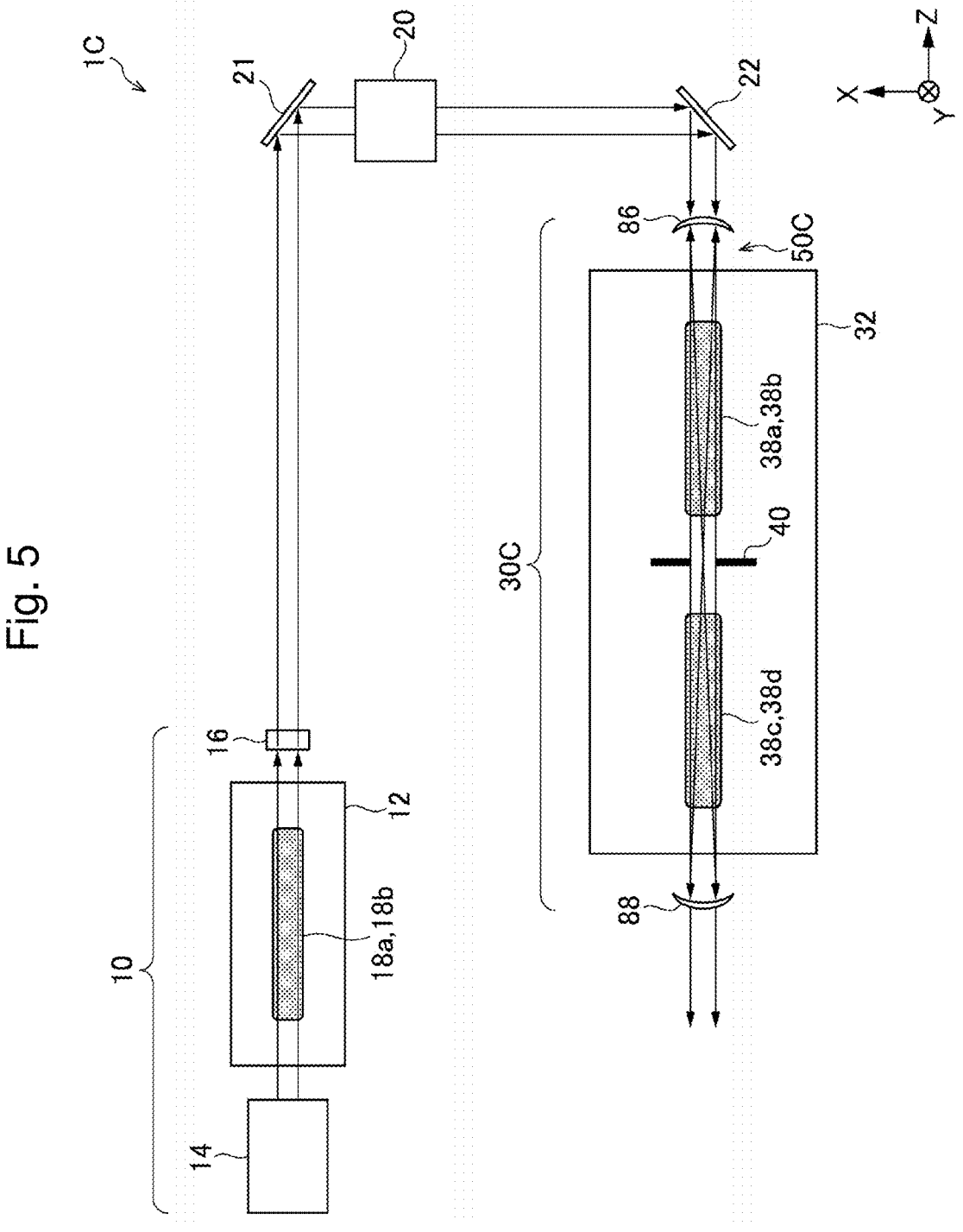
FIG. 5 is a diagram schematically illustrating a configuration of a laser apparatus according to Embodiment 3.

FIG. 5 is a diagram schematically illustrating a configuration of a laser apparatus 1C according to Embodiment 3. The configuration illustrated in FIG. 5 will be described in terms of differences from the configuration illustrated in FIG. 1.

The laser apparatus 1C includes an amplification stage laser 30C instead of the amplification stage laser 30 of the laser apparatus 1. The amplification stage laser 30C includes the chamber 32 and a confocal resonator 50C.

The confocal resonator 50C is formed of a rear mirror 86 and an OC 88. Each of the rear mirror 86 and the OC 88 has a concave shape on an inner surface of the resonator, and has the same radius of curvature as a resonator length. A reflectance of the OC 88 is, for example, 10% to 20%.

The pulse laser beam output from the oscillation stage laser 10 is reflected by the high reflective mirror 22, and enters the amplification stage laser 30C from the rear mirror 86.

The confocal resonator 50C is a special transfer optical system in which a transfer position and a light condensing position coincide with each other.

The discharge electrodes 38a and 38b, the slit 40, and the discharge electrodes 38c and 38d are disposed inside the chamber 32. The configuration of the chamber 32 may be similar to that in FIG. 2. The slit 40 is disposed at a transfer position when the rear mirror 86 and the OC 88 forming the confocal resonator 50C are the transfer optical system. The transfer position may be between the discharge electrodes 38a and 38b and the discharge electrodes 38c and 38d. The chamber 32 illustrated in FIG. 5 is an example of a "fourth chamber" in the present disclosure.

The slit 40 limits the beam size in the X direction orthogonal to the Y direction intersecting an optical path of the confocal resonator 50C, that is, in the direction orthogonal to the discharge direction. In addition, the slit 40 may also limit the beam size in the Y direction intersecting an optical path of the confocal resonator 50C, that is, in the discharge direction. An opening size in the Y direction of the slit 40 in this case is equal to the interval of the discharge electrodes 38a and 38b or is shorter than the interval of the discharge electrodes 38a and 38b. The other configurations may be similar to those in FIG. 1.

4.2 Operation

In the laser apparatus 1C, the pulse laser beam transmitted through the rear mirror 86 reciprocates in the confocal resonator 50C. The pulse laser beam is made into parallel light when it is directed to the OC 88 from the rear mirror 86. The light reflected by the OC 88 is condensed to be focused between the rear mirror 86 and the OC 88, and is then propagated while spreading. The light reflected by the rear mirror 86 is made into the parallel light and is propagated toward the OC 88.

The pulse laser beam reciprocating in the confocal resonator 50C is amplified when passing through the discharge space of one of the two pairs of the discharge electrodes 38a and 38b and 38c and 38d.

For the pulse laser beam reciprocating in the confocal resonator 50C, the beam size in the direction (X direction) orthogonal to the discharge direction (Y direction) is limited by the slit 40.

In this way, the pulse laser beam having the beam size equivalent to the beam size at the transfer position of the confocal resonator 50C, which is the transfer optical system, is output from the OC 88. As a result, the pulse laser beam having the beam size in the X direction equivalent to the size (slit width) in the X direction of the slit 40 is output from the OC 88. The rest of the operation is similar to that of the laser apparatus 1A.

4.3 Effect

With the laser apparatus 1C according to Embodiment 3, the same effects as those of the laser apparatus 1A can be obtained. Further, since the laser apparatus 1C has a shorter resonator length than the laser apparatus 1A, the number of times of circulation within a discharge period is increased so that laser output can be increased.

5. Modification

Instead of the oscillation stage laser 10 which is a line narrowing gas laser apparatus, a solid-state laser system including a semiconductor laser and a wavelength conversion system may be used.

6. Electronic Device Manufacturing Method

Figure 6:
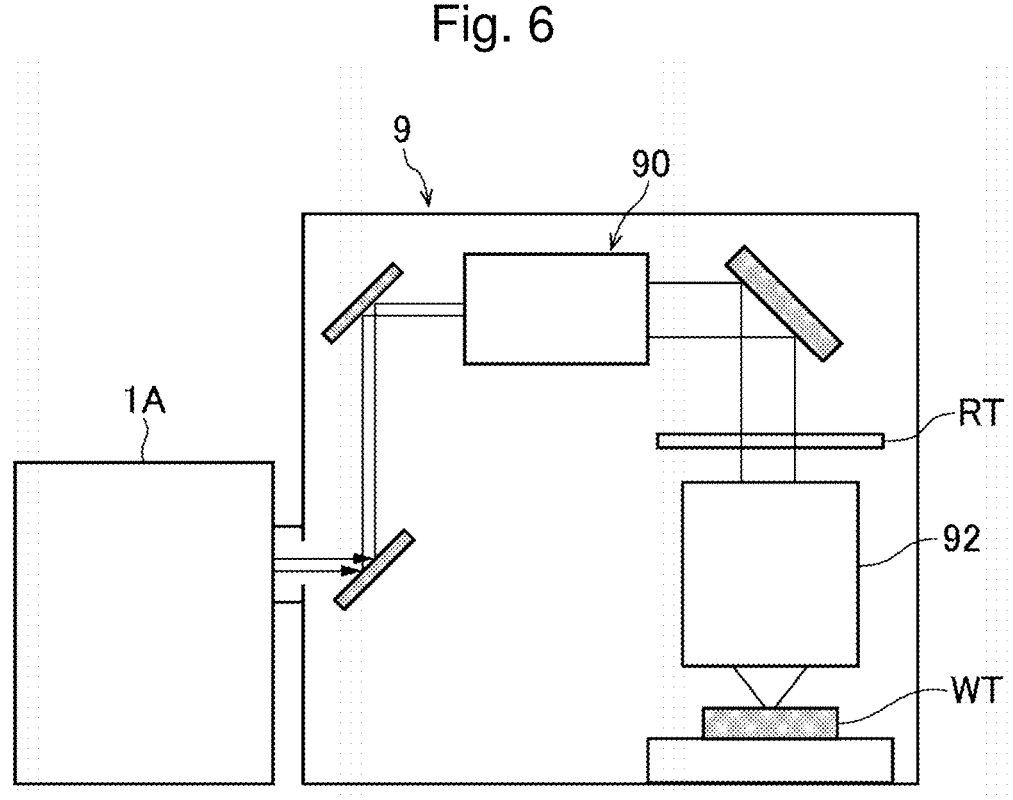
FIG. 6 is a diagram schematically illustrating a configuration of an exposure apparatus.

FIG. 6 is a diagram schematically illustrating a configuration of an exposure apparatus 9. In FIG. 6, the exposure apparatus 9 includes an illumination optical system 90 and a projection optical system 92. The illumination optical system 90 illuminates a reticle pattern of an unillustrated reticle disposed on a reticle stage RT with a laser beam that has entered from the laser apparatus 1A. The projection optical system 92 performs reduced projection of the laser beam transmitted through the reticle, and forms an image on an unillustrated workpiece disposed on a workpiece table WT. The workpiece is a photosensitive substrate such as a semiconductor wafer on which a resist film is applied.

The exposure apparatus 9 synchronously translates the reticle stage RT and the workpiece table WT to expose the workpiece to the laser beam reflecting the reticle pattern. After the reticle pattern is transferred onto the semiconductor wafer by such an exposure process, a semiconductor device can be manufactured through a plurality of processes. The semiconductor device is an example of an "electronic device" in the present disclosure. Instead of the laser apparatus 1A, the laser apparatus 1B or the laser apparatus 1C may be used to generate a laser beam.

7. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A laser apparatus comprising:
an oscillation stage laser configured to generate and output a pulse laser beam; and
an amplification stage laser configured to amplify the pulse laser beam output from the oscillation stage laser,
the amplification stage laser including
an optical resonator configured to be a transfer optical system,
a first discharge electrode pair and a second discharge electrode pair separated from each other in a first direction intersecting an optical path of the optical resonator, the first discharge electrode pair and the second discharge electrode pair being disposed across the optical path and configured to alternately discharge, and
a slit disposed at a transfer position of the transfer optical system and configured to limit a beam size in a second direction orthogonal to the first direction of the pulse laser beam amplified by discharge of one of the first discharge electrode pair and the second discharge electrode pair.

2. The laser apparatus according to claim 1, wherein the optical resonator is a ring resonator.

3. The laser apparatus according to claim 2, wherein
the amplification stage laser includes a first chamber
disposed on an optical path of the optical resonator, and
the first discharge electrode pair and the second discharge
electrode pair are disposed inside the first chamber.

4. The laser apparatus according to claim 3, wherein
the optical resonator includes two light condensing lenses,
and
the transfer position is between the first discharge electrode pair and the second discharge electrode pair.

5. The laser apparatus according to claim 4, wherein
a light condensing position by the two light condensing
lenses of the pulse laser beam circulating in the ring
resonator is outside the first chamber.

6. The laser apparatus according to claim 3, wherein
the slit further limits a beam size in the first direction.

7. The laser apparatus according to claim 2, wherein
the amplification stage laser includes a second chamber
and a third chamber disposed on the optical path of the
optical resonator,
the first discharge electrode pair is disposed inside the
second chamber, and
the second discharge electrode pair is disposed inside the
third chamber.

8. The laser apparatus according to claim 7, wherein
the optical resonator includes four light condensing
lenses,
the transfer position includes a first position where the
first discharge electrode pair is disposed and a second
position where the second discharge electrode pair is
disposed, and
the slit is disposed at at least one of the first position and
the second position.

9. The laser apparatus according to claim 8, wherein
light condensing positions by the four light condensing
lenses of the pulse laser beam circulating in the ring
resonator are outside of the second chamber and the
third chamber.

10. The laser apparatus according to claim 1, wherein
the optical resonator is a confocal resonator.

11. The laser apparatus according to claim 10, wherein
the amplification stage laser includes a fourth chamber
disposed on the optical path of the optical resonator,
and
the first discharge electrode pair and the second discharge
electrode pair are disposed inside the fourth chamber.

12. The laser apparatus according to claim 11, wherein
the transfer position of the optical resonator is between
the first discharge electrode pair and the second discharge electrode pair.

13. The laser apparatus according to claim 12, wherein
the slit further limits a beam size in the first direction.

14. The laser apparatus according to claim 1, wherein
a separation interval of the first discharge electrode pair
and a separation interval of the second discharge electrode pair are the same.

15. The laser apparatus according to claim 1, wherein
an electrode length of the first discharge electrode pair and
an electrode length of the second discharge electrode
pair are the same.

16. The laser apparatus according to claim 1, wherein
the oscillation stage laser includes a chamber, and
a discharge electrode pair is disposed inside the chamber.

17. The laser apparatus according to claim 16, wherein
each separation interval of the first discharge electrode
pair and the second discharge electrode pair is wider
than a separation interval of the discharge electrode
pair of the oscillation stage laser.

18. The laser apparatus according to claim 16, wherein
a repetition frequency of discharge of the discharge electrode pair is twice a repetition frequency of discharge
of each of the first discharge electrode pair and the
second discharge electrode pair.

19. An electronic device manufacturing method comprising:
generating a laser beam with a laser apparatus, the laser
apparatus including
an oscillation stage laser configured to generate and
output a pulse laser beam, and
an amplification stage laser configured to amplify the
pulse laser beam output from the oscillation stage
laser,
the amplification stage laser including
an optical resonator configured to be a transfer optical
system,
a first discharge electrode pair and a second discharge
electrode pair separated from each other in a first
direction intersecting an optical path of the optical
resonator, the first discharge electrode pair and the
second discharge electrode pair being disposed
across the optical path and configured to alternately
discharge, and
a slit disposed at a transfer position of the transfer
optical system and configured to limit a beam size in
a second direction orthogonal to the first direction of
the pulse laser beam amplified by discharge of one of
the first discharge electrode pair and the second
discharge electrode pair;
outputting the laser beam to an exposure apparatus; and
exposing a photosensitive substrate to the laser beam
within the exposure apparatus to manufacture an electronic device.

* * * * *